United States Patent [19]

Burghartz et al.

[11] Patent Number: 5,461,250
[45] Date of Patent: Oct. 24, 1995

[54] SIGE THIN FILM OR SOI MOSFET AND METHOD FOR MAKING THE SAME

[75] Inventors: Joachim N. Burghartz, Shrub Oak; Bernard S. Meyerson, Yorktown Heights; Yuan-Chen Sun, Katonah, all of N.Y.

[73] Assignee: International Business Machines Corporation, Armonk, N.Y.

[21] Appl. No.: 927,901

[22] Filed: Aug. 10, 1992

[51] Int. Cl.$^6$ .................................................. H01L 27/12
[52] U.S. Cl. ........................ 257/347; 257/365; 257/66; 257/192; 257/194; 437/126
[58] Field of Search ........................ 257/347, 348, 257/365, 366, 66, 191, 192, 194, 616; 437/126

[56] References Cited

U.S. PATENT DOCUMENTS

| | | | |
|---|---|---|---|
| 4,597,160 | 7/1986 | Ipri | 29/571 |
| 4,697,197 | 9/1987 | Dresner | 257/16 |
| 4,841,481 | 6/1989 | Ikeda et al. | 365/154 |
| 4,918,510 | 4/1990 | Pfiester | 257/69 |
| 4,921,813 | 5/1990 | Madan | 437/46 |
| 4,992,386 | 2/1991 | Furuyama et al. | 437/3 |
| 5,019,882 | 5/1991 | Solomon et al. | 257/409 |
| 5,140,391 | 8/1992 | Hayashi et al. | 257/365 |
| 5,272,365 | 12/1993 | Nakagawa | 257/192 |

FOREIGN PATENT DOCUMENTS

| | | |
|---|---|---|
| 0304824A2 | 3/1989 | European Pat. Off. . |
| 0494395A2 | 7/1992 | European Pat. Off. . |
| 0494395 | 7/1992 | European Pat. Off. . |
| 0230374 | 10/1986 | Japan . |
| 0248668 | 10/1989 | Japan . |

OTHER PUBLICATIONS

Reita et al., "Theoretical Analysis of a–Si:H Based Multilayer Structure Thin Film Transistors", *Japanese Journal of Applied Physics*, vol. 29, No. 9, Sep. 1990, pp. 1634–1638.
Patent Abstracts of Japan, vol. 013, No. 459 (E–832) Oct. 17, 1989, & JP-A-01 179 448, Jul. 17, 1989.
Patent Abstracts of Japan, vol. 011, No. 341 (E–554) (2788), Nov. 7, 1987, & JP-A-62 122 275, Jun. 3, 1987.
Patent Abstracts of Japan, vol. 011, No. 224 (E–525), Jul. 21, 1987, & JP-A-62 042 566, Feb. 24, 1987.
Lang et al., "Measurement of the Band Gap of $Ge_xSi_{1-x}$/Si Strained–Layer Heterostructures," Applied Physics Lett., vol. 47, No. 12, pp. 1333–1335, Dec. 15, 1985.
E. Kasper, "Growth and Properties of Si/SiGe Superlattices," *Surface Science*, vol. 174, pp. 630–639, 1986.
Pearsall et al., "Enhancement– and Depletion–Mode p–Channel $Ge_xSi_{1-x}$ Modulation–Doped FET's," *IEEE Electron Device Letters*, vol. EDL-7, No. 5, pp. 308–310, May 1986.
Taft et al., "Fabrication of a p–channel BICFET in the $Ge_xSi_{1-x}$/Si System," *IEDM*, pp. 570–573, 1988.
Wang et al., "Two–Dimensional Hole gas in $Si/Si_{0.85}Ge_{0.15}$/Si Modulation–Doped Double Heterostructures," Applied Physics Lett., vol. 54, No. 12, pp. 2701–2703, Jun. 1989.
Kinugawa et al., *TFT (Thin Film Transistor) Cell Technology for 4Mbit and More High Density SRAMs*, Tech. Dig. of 1990 VLS Technol. ymp.: 23–24 (1990).
Uemoto et al., *High– Performance Stacked–CMOS SRAM Cell by Solid Phase Growth Techniques*, Tech Dig. of 1990 VLSI Technol. Symp.: 21–22 (1990).
Adan et al., *A Half–Micron SRAM Cell Using a Double–Gated Self–Aligned Polysilicon PMOS Thin Film Transistor (TFT) Load*, Tech. Dig. of 1990 VLSI Technol. Symp.: 19–20 (1990).

(List continued on next page.)

Primary Examiner—Mark V. Prenty
Attorney, Agent, or Firm—Sterne, Kessler, Goldstein & Fox; David Aker

[57] ABSTRACT

A dual gate thin film or SOI MOSFET device having a sufficiently thin body thickness with one or more semiconductor channel layer(s) sandwiched by semiconductor layers having a different energy band structure to automatically confine carriers to the channel layer(s) without the need for channel grading or modulation doping. Preferred embodiments employ strained layer epitaxy having Si/SiGe/Si or SiGe/Si/SiGe semiconductor layers.

18 Claims, 3 Drawing Sheets

OTHER PUBLICATIONS

Hashimoto et al., *Thin Film Effects of Double–Gate Polysilicon MOSFET,* Ext. Abst. of 22nd Conf. on Solid St. Dev. and Mat.: 393–396 (1990).

Vandebroek et al., *Graded SiGe–Channel Modulation Doped P–MOSFETs.*

Horie et al., *Fabrication of Double–Gate Thin–Film SOI MOSFETs Using Wafer Bonding and Polishing,* Technical Digest of the 1991 Solid State Device and Materials Conference, Yokohama, Japan: 165–167.

SIGE THIN FILM OR SOI MOSFET AND METHOD FOR MAKING THE SAME

TECHNICAL FIELD

The field of the invention relates generally to semiconductor devices and manufacturing, and more particularly, to thin film transistors (TFT) or semiconductor-on-insulator (SOI) field-effect transistors.

BACKGROUND ART

Currently, high density (greater than 4 megabytes (Mb) of data storage per chip) and high speed bipolar-complementary MOS (BICMOS) and CMOS static random access memories (SRAMs) require memory cell size below 20 $\mu m^2$, low standby current, and high cell stability at low operating voltage. Thin Film Transistors (TFT) were proposed as the load device in the memory cell to replace polysilicon load resistors, in order to meet the density, standby current, cell stability, and soft error immunity requirements. However, conventional polysilicon TFTs have high threshold voltage and low mobility, and therefore poor ON current, due to the finite size of polysilicon grains.

Large grains created by recrystallization of amorphous silicon ($\alpha$-Si) films have been used to minimize grain boundary scattering to improve ON current, and to reduce generation-recombination at grain boundaries to minimize the OFF current. (See: Kinugawa et al., TFT (Thin Film Transistor) Cell Technology for 4Mbit and More High Density SRAMs, Tech. Dig. of 1990 VLSI Technol. Symp.:23–24 (1990); and Uemoto et al., High-Performance Stacked-CMOS SRAM Cell by Solid Phase Growth Techniques, Tech Dig. of 1990 VLSI Technol. Symp.:21–22 (1990)).

Thinning of the polysilicon layer and the use of double gates (top and bottom) have provided better ON current and ON/OFF current ratio. (See: Adan et al., A Half-Micron SRAM Cell Using a Double-Gated Self-Aligned Polysilicon PMOS Thin Film Transistor (TFT) Load, Tech. Dig. of 1990 VLSI Technol. Symp.:19–20 (1990); and Hashimoto et al., Thin Film Effects of Double-Gate Polysilicon MOSFET, Ext. Abst. of 22nd Conf. on Solid St. Dev. and Mat.:393–396 (1990)). However, the ON current requirement for 4 Mb (or higher) density, high speed (sub 5 ns) SRAMs is difficult to meet with Si TFTs because of mobility limitations and the lack of grain size uniformity control. What is desired is a TFT with a high carrier mobility.

Other materials, such as germanium, have different energy band structures resulting in higher carrier mobilities. Such higher carrier mobilities are desirable because the mobility of carriers ultimately determines the switching speed of the device. The faster the switching speed, the more operations the given device can perform within a given unit of time.

Silicon-germanium (SiGe) alloys can be grown on a Si substrate so long as the alloy layer is sufficiently thin. See, T. P. Pearsall et al., Enhancement- and depletion-mode p-channel $Ge_xSi_{1-x}$ modulation doped FETs, IEEE Electron Device Letters, EDL-7: 308–310 (1986), and R. C. Taft et al., Fabrication of a p-channel BICFET in the $Ge_xSi_{1-x}$/Si system, International Electron Device Conf. Digest: 570–573 (1988). Because the lattice spacing of a crystal of Ge is larger than the lattice spacing of a crystal of silicon, a layer that includes an alloy of Ge and Si is placed under strain when grown. The Ge crystal lattice is compressed and provides a so-called pseudomorphic layer. See E. Kasper, Growth and Properties of Si/SiGe Superlattices, MSS-II Proceedings, Kyoto, Japan: page 703 (September 1975); D. V. Lang, Measurement of the Band Gap of $Ge_xSi_{1-x}$/Si Strained Layer Heterostructures, Applied Physics Letters, 47: page 1333 (1985). With such strained layers, several groups have demonstrated that two-dimensional electron and hole gas layers can be formed. It has recently been shown that the mobility of holes is higher in layers formed of an alloy of Si and Ge than in pure silicon. See, P. J. Wang, et al., Two-dimensional hole gas in $Si/S_{0.85}Ge_{0.15}$/Si modulation-doped double heterostructures, Appl. Phys. Lett. Vol. 54, No. 26: page 2701 (1989).

It is possible that the hole mobility in such a system is enhanced by the strain in the alloy layer which decreases the energy of the light hole band relative to the heavy hole band. In such a system, the conduction and valence band discontinuities are relatively low compared to group III–V compound materials. In addition, small Schottky barrier heights on Si would make commercial utilization of the MODFET devices of Pearsall et al. impractical because of a high gate leakage current, particularly at room temperature.

European Patent 0 323 896 AZ discloses a conventional MOSFET device which incorporates a Ge channel region formed of a 90–100% Ge in Si alloy. The channel is symmetric. At each edge of the channel there is an identical transition region from the 90–100% Ge in Si alloy to the surrounding regions of pure Si. Graded regions are provided at each channel edge to accommodate the well known lattice mismatch between Si and Ge, that mismatch being 4.0%. This structure results in the generation of in excess of $10^9$ defects per square centimeter in this mostly Ge layer due to the severe mismatch between this layer's lattice constant and that of the Si substrate. Such defects are well known to limit carrier mobility.

Apart from this mechanical consideration, the Ge profile in the channel, as in the prior art, is symmetric and uniform throughout the mostly Ge region. Thus, two active transport regions will be formed at the edges of this channel, one at the transition from the Si substrate to the 90–100% Ge channel, and the other at the transition region back to pure Si at the surface of the device. Each transport region contains a two-dimensional hole gas, centered at each edge of the Ge plateau. Each hole gas has a finite spatial extent, such that half the carriers overlap the defected transition region beyond each plateau edge. This also degrades the mobility of carriers residing in these defected regions. Equally important, hole mobility decreases when holes travel in a region of reduced Ge content, as is the case in prior SiGe channel MOSFET designs.

In U.S. patent application Ser. No. 07/351,630, filed May 15, 1989 and assigned to the same assignee as the present invention, there is disclosed a MOSFET having a SiGe channel layer grown on a Si substrate. A Si cap layer separates the Si dioxide insulator layer from the channel layer. A suitably applied voltage will result in a region of high mobility charge carriers at the interface between the SiGe alloy layer and the Si cap layer. This region will contain a two-dimensional electron or hole gas. By forming the electron or hole gas at the SiGe/Si interface rather than the $Si/SiO_2$ interface as in previous devices, interface scattering is decreased or eliminated. The region of high mobility charge carriers is as near as possible to the gate (at the Si/SiGe interface), and thus the capacitance is maximized and device performance is enhanced. However, carrier mobility is actually at its lowest nearest the gate. Hence, the device transconductance, which is a figure of merit that is linearly proportional to both capacitance and mobility is not optimized. Furthermore, the channel region described in this earlier work is symmetric as in all known prior devices. The abrupt transitions between Si and SiGe regions in such a symmetric structure result in a number of carriers being transported outside of the channel region.

In U.S. patent application, titled "A Graded Channel Field Effect Transistor," Ser. No. 07/639,625, file Jan. 10, 1991 and now abandoned, and assigned to the same assignee as the present invention, there is disclosed a MISFET having a graded semiconductor alloy channel layer wherein the grading results in the charge carriers being positioned within the channel layer at a location in which transconductance will be optimized. The MISFET includes a strained, pseudomorphic, epitaxial channel layer of an alloy of a first semiconductor material and a second semiconductor material disposed over a substrate. The alloy has a percentage of the second semiconductor material graded within the channel layer to a single peak-percentage level such that the location of carriers within the channel layer coincides with the peak percentage level. An epitaxial cap layer of the first semiconductor material is disposed over the channel layer and a gate insulator layer is disposed over the cap layer. A gate electrode is disposed over the gate insulator layer and source and drain regions are formed in the cap layer and the channel layer on opposite sides of the gate electrode. In one embodiment of the MISFET, the channel layer is formed of a SiGe alloy on a Si substrate.

The channel profile is graded to control the location of the charge carriers in the channel layer to maximize transconductance. The grading results in a built-in electric field which drives the carriers to the desired location in the channel. The graded alloy channel MISFET avoids the problem of the two active transport regions formed in prior devices, as only a single transport region is formed at the location of the single peak-percentage level of the second semiconductor material.

In addition, in prior SiGe channel devices, because the band offset between Si and SiGe is small, a two-dimensional hole gas formed at that interface will spill over into the Si layer, a layer of lesser mobility. In the MISFET, this problem can be avoided by locating the carriers spaced from this interface in order to maintain all or substantially all of the hole gas within the SiGe higher mobility channel. The location of carriers within the channel can be controlled by grading the Ge concentration in Si to a maximum with that maximum being located anywhere in the channel but spaced from either interface. The point of maximum concentration determines the location of the carriers. The particular location within the channel is said to depend on the desired device characteristics.

A additional modulation doping technique is employed in the MISFET device in which the carriers are located below the channel layer. First, a narrow in situ doped boron layer is grown. The total integrated dose, which can be very accurately controlled with low temperature epitaxy, determines the threshold voltage of the device. The doped layer is separated from the SiGe channel by a small undoped spacer, to physically separate the ionized acceptors from the holes in the SiGe channel. Thicker spacers can result in a deleterious parasitic substrate channel.

By modulation doping the channel region of a MISFET, the carriers are physically separated from the ionized atoms, thus allowing high carrier concentrations with negligible ionized impurity scattering and hence high mobilities compared to uniformly doped SiGe MOSFETs. In addition, by locating the dopant below the SiGe channel rather than above as in both the MODFET and the BICFET, the process sensitivity is greatly improved as thinning of the Si cap layer during device fabrication does not affect the total integrated doping and thus the threshold voltage. Compared to the uniformly doped SiGe MOSFET, the parasitic surface channel of the modulation doped device depends much less critically on the Si cap thickness and hence on process variations. The modulation doped device maximizes the ratio of carriers in the SiGe channel over those in both the surface and substrate parasitic channels compared to the uniform SiGe MOSFET. However, the MISFET is a bulk Si device.

The MISFET device itself and the processing therefore do not lend themselves to direct application in thin film devices. It is therefore desirable to provide a TFT device with the operational advantages of the modulation doped MISFET, and can be integrated into high density memories or the like.

DISCLOSURE OF INVENTION

The present invention is directed to TFT or SOI MOSFET devices and a method of manufacturing those devices for integration in high density memories, or the like, to provide fast switching, very high ON current and a large ON/OFF current ratio.

A preferred embodiment of the present invention comprises one or more relatively thin layers of SiGe sandwiched between layers of Si. The SiGe and Si layers are formed on an insulating substrate and are doped to form a source and a drain region to thereby define a channel region.

The SiGe layer(s) is pseudomorphically grown on the Si and is therefore placed under compressive strain. The upper edge of the valence band in the SiGe is placed above the upper edge of the valence band of the Si layer because of the strain. The hole carriers in the strained SiGe therefore have a lower energy state. A similar effect occurs with electrons when a Si lattice is placed under tensile strain for growth on SiGe.

The total TFT body thickness of the SiGe and Si layers is scaled down. This scaled-down body thickness and the resulting band structure discussed above cause holes to be automatically confined to the SiGe layer(s). The carrier flow within the SiGe channel is significantly increased by optimizing the transconductance using two gate electrodes, the first above the channel and the second below the channel. The gate-to-channel capacitance is lower than non-buried channel devices, because carrier flow is located away from the gate electrodes. This also helps prevent dielectric breakdown of the gate insulator(s).

At zero gate bias, the SiGe channel(s) can be fully depleted of minority current carriers and turned off with very little current flowing between the source and drain. As the gate bias is negatively increased, minority carriers begin to pile up and become confined within the high mobility SiGe layer and provide higher hole current than conventional Si TFTs.

Conductivity enhancement is possible even at high gate bias because a significant fraction of minority carriers will remain in the SiGe channel layer and carrier mobility in SiGe can be a thousand times higher than in bulk Si or at a $SiO_2$/Si interface.

Thus, the dual gate TFT of the present invention eliminates the need for modulation doping and channel grading as in prior bulk SiGe MISFET devices by automatic confinement of carriers in the SiGe channel layer. Channel grading, however, can be used to help confine carriers if the body thickness is not minimized.

The foregoing and other features and advantages of the present invention will be apparent from the following more particular description of preferred embodiments of the invention, as illustrated in the accompanying drawings.

BRIEF DESCRIPTION OF THE DRAWINGS

The invention will be better understood if reference is made to the accompanying drawings in which.

In the drawings, like reference numbers indicate identical or functionally similar elements. Additionally, the left-most digit of the reference number identifies the drawing in which the reference number first appears.

BEST MODE FOR CARRYING OUT THE INVENTION

The present invention is directed to a thin film field effect transistor (TFT) having (one or more) alloy channels or a graded alloy channel. The invention may be implemented in Si or Ge materials or in group III–V/II–VI material systems. For purposes of explanation, the invention will be described in SiGe material systems on insulating substrates, but it will be understood by those skilled in the art that the invention described herein can also be implemented with the III–V/II–VI systems.

A more detailed description of some of the basic concepts discussed in this section is found in a number of references, including S. M. Sze, Physics of Semiconductor Devices, John Wiley & Sons, Inc., New York, (1981), and Semiconductor Devices, Physics and Technology, John Wiley & Sons, Inc., New York, (1985).

Figure 1:
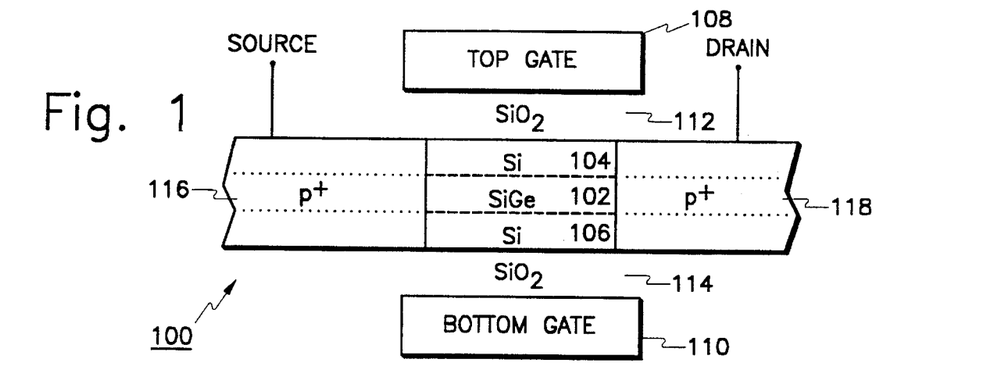
FIG. 1 illustrates a representative cross sectional view of a SiGe TFT of the present invention.

FIG. 1 illustrates a representative cross sectional view of a SiGe TFT 100 of the present invention. The SiGe TFT 100 has a SiGe channel 102 (4–10 nm, preferably 5 nm, where the concentration of Ge is about 10–50%, and preferably 20–40%), sandwiched between two thin (1–5 nm, preferably 3 nm) Si layers 104 and 106. The Si layer 104 is also called a top channel or first spacer layer, and the Si layer 106 is also called a substrate channel or second spacer layer. A pair of top and bottom gate electrodes 108 and 110 are used to modulate carriers in the channel and thereby turn the transistor on and off in a known fashion. (The terms top and bottom are used only for ease of explanation.) High quality silicon dioxide ($SiO_2$) gate insulators 112 and 114 can be deposited or thermally grown to a thickness less than or equal to about 10 nm.

Also shown in FIG. 1 are high conductivity source and drain regions 116 and 118, respectively. In one embodiment, the source and drain regions 116 and 118 are formed by masking the channel region $p^+$-doping the Si/SiGe/Si layers. Connection to, and biasing of, the gates 108 and 110 and the source and drain regions 116 and 118 are performed in a conventional manner, as will become evident to those skilled in the art.

The SiGe channel 102 and Si layers 104 and 106 are effectively laterally sandwiched between the source and drain regions 116 and 118, and are thus considered contiguous to those regions. The SiGe channel 102 is effectively vertically sandwiched (see FIG. 1) by Si layers 104 and 106. The Si layers 104 and 106 are also considered contiguous with the source and drain regions. The combination of the SiGe channel 102 and Si layers 104 and 106 are effectively sandwiched in the thickness direction (shown as the vertical direction in the FIGS. 1–3) by the gate insulators 112 and 114; the latter combination is effectively sandwiched in the thickness direction by the gate electrodes 108 and 110.

A substrate for supporting the SiGe TFT 100 is not shown in FIG. 1. In an SOI embodiment, the substrate may be an insulating substrate such as oxide, sapphire, diamond, or the like. Alternatively, for a TFT embodiment the substrate may be Si. Alternatively, the SOI or TFT MOSFETs of the present invention may be stacked to form multiple-layer integrated circuits. In this case, SOI or TFT MOSFETs may themselves function as substrates for further stacked SOI or TFT MOSFETs.

At zero gate bias, the SiGe channel 102 can be fully depleted of minority current carriers (holes) and turned off with very little current flowing between the source 116 and drain 118. As gate bias is negatively increased, minority carriers begin to pile up and become confined within the high mobility SiGe layer near the SiGe/Si interface, and hence, provide higher hole current than conventional Si TFTs.

Conductivity enhancement is possible even at high gate bias because a significant fraction of minority carriers will remain in the SiGe channel layer 102 and carrier mobility in SiGe can be a thousand times higher than in bulk Si or at the $SiO_2$/Si interface.

Moreover, if the total TFT body thickness is scaled down a major portion of the minority carriers will automatically be confined in the SiGe channel layer 102, which will result in very high ON current. The term "total TFT body thickness" refers to the total thickness of the semiconductor layers sandwiched by the gate insulators 112 and 114.

In FIG. 1, for example, the total body thickness is the combined thickness of layers 102, 104 and 106. Representative thicknesses for "scaled down" layers 102–106 would be about 5 nm for SiGe layer 102, and about 2–3 nm for Si layers 104 and 106. Alternatively, layer 102 should be less than about 10 nm and layers 104 and 106 less than about 5 nm, for a total TFT body thickness of less than about 20 nm.

The energy band discontinuity between the Si layers 104 and 106 and the SiGe layer 102 helps increase the ON current by confining minority carriers to the high mobility SiGe layer 102. In general, carriers tend to stay where their energy is the lowest. The material having the smaller bandgap usually gives the lower energy state, as in the case of a strained SiGe layer grown on Si, where the valence band edge of SiGe gives a lower energy state for holes compared with Si. (The strained layer epitaxy process is necessary to grow the SiGe on Si, because the lattice constant of SiGe is larger than that of Si).

The band gap and band structure play important roles in the present invention's ability to confine carriers to the channel. Hole mobility is enhanced by strain in the SiGe alloy layer which decreases the energy of the light hole band relative to the heavy hole band. For a Si layer strained by SiGe, electrons have a lower energy state at the conduction band edge of Si, as compared to that of the SiGe layer. These discontinuities are depicted in the energy band diagrams in FIGS. 5A and 5B.

Figure 5A:
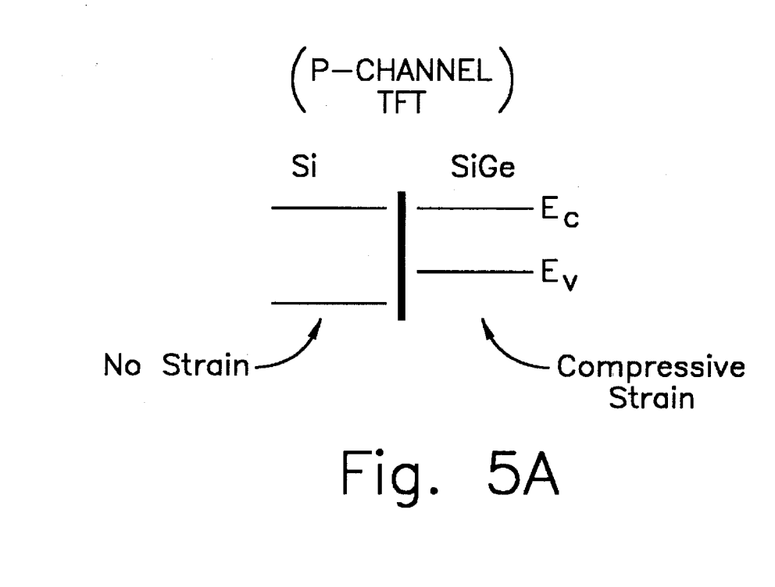
FIGS. 5A and 5B show energy band diagrams for pseudomorphic SiGe on Si and Si on SiGe, respectively.

FIG. 5A shows SiGe grown on Si, where the SiGe is under compressive strain (i.e, SiGe is pseudomorphic to Si), thus causing the valence band ($E_V$) to offset. The offset occurs where the $E_V$ for strained SiGe is above the $E_V$ for the Si. This $E_V$ offset occurs at each SiGe/Si interface. FIG. 5A represents the case of a p-channel TFT where the carriers (holes) are confined to the SiGe channel.

Figure 5B:
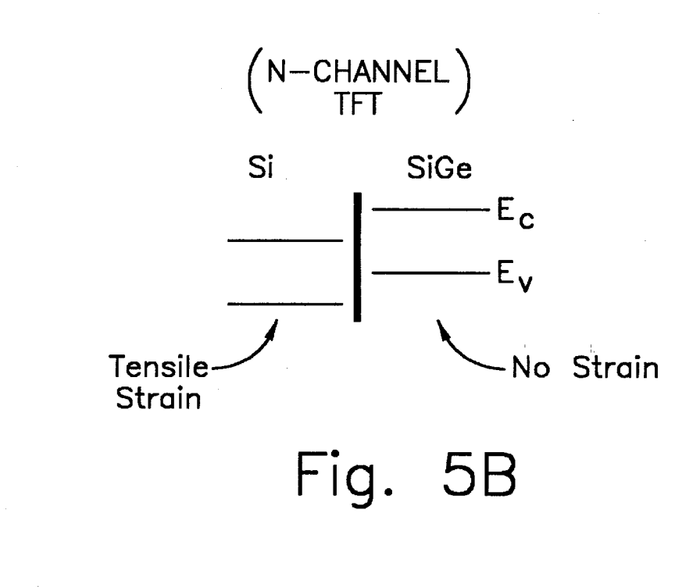

FIG. 5B shows a band diagram for Si grown on SiGe. The Si is under tensile strain (i.e, Si is pseudomorphic to SiGe), thus causing offset of both the conduction and the valence bands ($E_C$ and $E_V$, respectively). The $E_C$ of the Si layer is pulled down relative to $E_C$ for SiGe. FIG. 5B represents the case of an n-channel TFT where the carriers (electrons) are confined to the Si channel.

A large valence band discontinuity is also desirable at the bottom and top of the channel in order to confine all the mobile carriers in the SiGe channel (in the p-channel device) and suppress flow of carriers in the parasitic channels at either of the insulator/Si interfaces.

Accordingly, the electric field established by the negative voltage on gate attracts a large number of positive carriers in the SiGe channel layer 102. This concentration of positive carriers or holes assumes a two-dimensional configuration as the thickness of the SiGe channel is reduced. Positive charge carriers in the high mobility channel move in a substantially two-dimensional direction between source 116 and drain 118. When a two-dimensional hole gas is formed, the capacitance of the device will be maximized because the hole gas is as close to the gate as possible.

Figure 2:
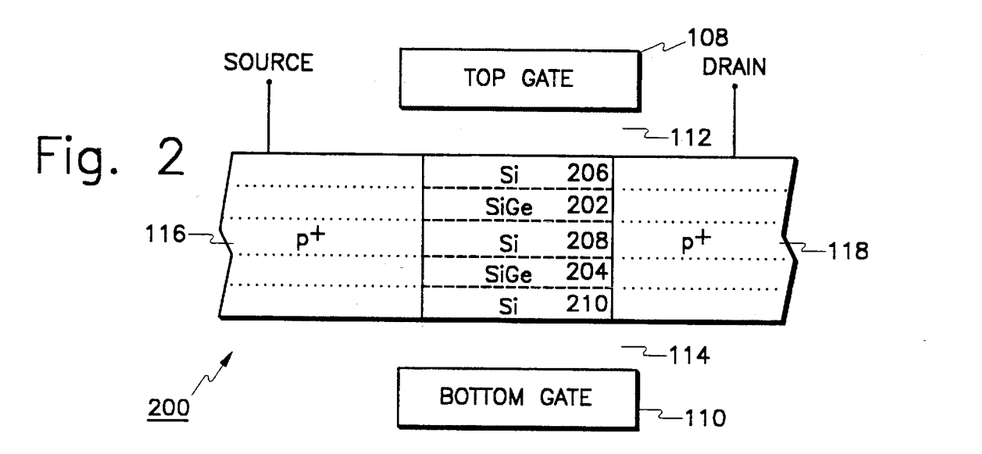
FIG. 2 illustrates a representative cross sectional view of a further embodiment of the SiGe TFT of the present invention.

Another embodiment of a SiGe TFT 200 of the present invention is shown in FIG. 2. The SiGe TFT 200 is essentially two SiGe TFT MOSFETs back to back, operated in parallel. The SiGe TFT 200 also comprises top and bottom gates 108 and 110, gate insulators 112 and 114, and $p^+$-source and drain regions 116 and 118. Two SiGe channel layers 202 and 204 are sandwiched by three Si layers 206, 208 and 210. As with the device in FIG. 1, carriers are restricted to the SiGe layers 202 and 204 during operation of the device shown in FIG. 2. IN a preferred embodiment in connection with the structure shown in FIG. 2, layers 202 and 204 have a thickness of less that about 10 nm, and layers 206, 208 and 210 have a thickness of less that about 5 nm. An example total body thickness for the device of FIG. 2 would comprise the total thickness of layers 202–210, or less that about 35 nm. In a further embodiment layer 208 can be modulation doped to help confine carriers to the channel layers 202 and 204 if the total body thickness so warrants.

Figure 3:
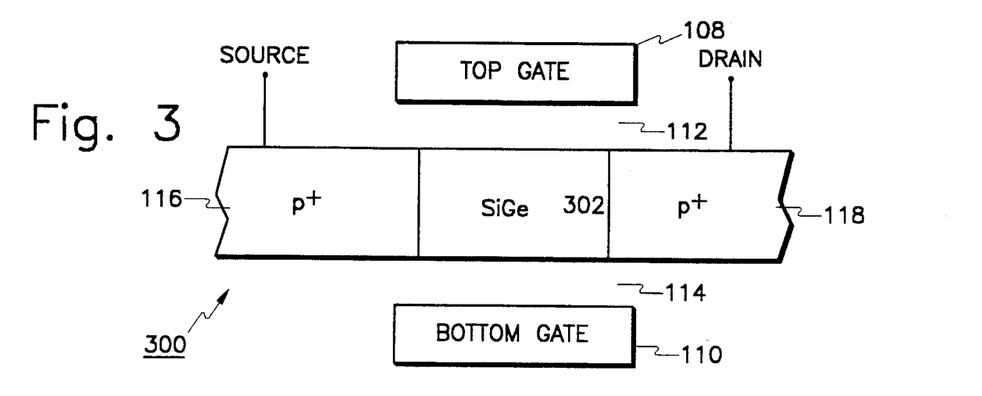
FIG. 3 illustrates a representative cross sectional view of a still further embodiment of the SiGe TFT of the present invention.

Alternatively, the entire body of the TFT MOSFET can be made of SiGe without the top and bottom Si layers. This third embodiment is shown in FIG. 3. The SiGe TFT 300 also comprises top and bottom gates 108 and 110, gate insulators 112 and 114, and $p^+$-source and drain regions 166 and 118. A single SiGe channel layer is shown at reference number 302. The top channel and substrate channel Si layers can be omitted provided that: (1) a high quality insulator and insulator/SiGe interface can be formed by deposition instead of thermally oxidizing the SiGe layer; and (2) a high quality amorphous SiGe layer can be deposited and later recrystallized without the bottom Si seed layer. An example total body thickness for FIG. 3 would comprise only layer 302 of between about 10–50 nm, preferably less than 20 nm. Grading of the percentage of Ge to a peak level of between 10–50% in the center of the channel 302 can be used to help confine carriers, in addition to the confinement achieved by the thin body thickness.

The threshold voltage of the SiGe SOI or TFT MOSFET can be tailored by in situ doping of the TFT body or by ion implantation. The top and bottom gate electrodes can be either $n^+$- or $p^+$-polysilicon. Taking the p-MOSFET in FIG. 1 and using an $n^+$-polysilicon gate electrode as an example, a spike doping of boron (p-type impurity) can be positioned in the middle of the SiGe layer 102 to adjust the threshold voltage and provide a high ON current in a buried-channel mode of FET operation. This is particularly useful when the energy band discontinuity due to SiGe alone is insufficient to confine carriers within the high conductivity SiGe layer. However, the SOI embodiment is preferred because spike doping and grading to achieve higher Ge concentration adjacent SiGe/Si channel boundaries is eliminated by the combination of the thin SOI total body thickness and the dual gate electrode structure. A thin SOI total body thickness implies a thin SiGe channel layer(s).

Furthermore, tailoring of the threshold voltage of the device can be accomplished by changing the workfunction of the gate electrodes. Any suitable material having a workfunction value ranging between the value for $n^+$- and $p^+$-polysilicon is desired (e.g., tungsten or tungsten silicide), as will become evident to those skilled in the art.

The present invention is considered an advanced buried channel device. The thin SOI body thickness and dual gate structure of the present invention permit easy adjustment of the threshold voltage by simply changing the workfunction of the two gates. High mobility by confining the carriers to the channel can still be maintained without modulation doping. Without modulation doping, a MISFET of the type discussed above in the Background Section would be unable to confine carriers (e.g., holes) to the channel. The holes would spill into the top, low mobility Si channel layer and the "buried" SiGe channel would be much less effective.

Specific operational or implementation requirements of devices made according to the principles of the present invention may require low parasitic contact resistance for the source and drain, and thereby necessitate increasing the overall thickness of the SOI layer (i.e., the total thickness of all Si and SiGe layers on the insulating substrate). Increasing the thickness of the channel layer, however, may prevent automatic confinement of the carriers to the high mobility channel. Therefore, grading of the high mobility channel may be employed for thicker devices to help confine the carriers and improve overall performance. For the dual gate p-channel TFT, for example, a peak concentration of Ge in middle the SiGe channel is preferred.

Figure 4:
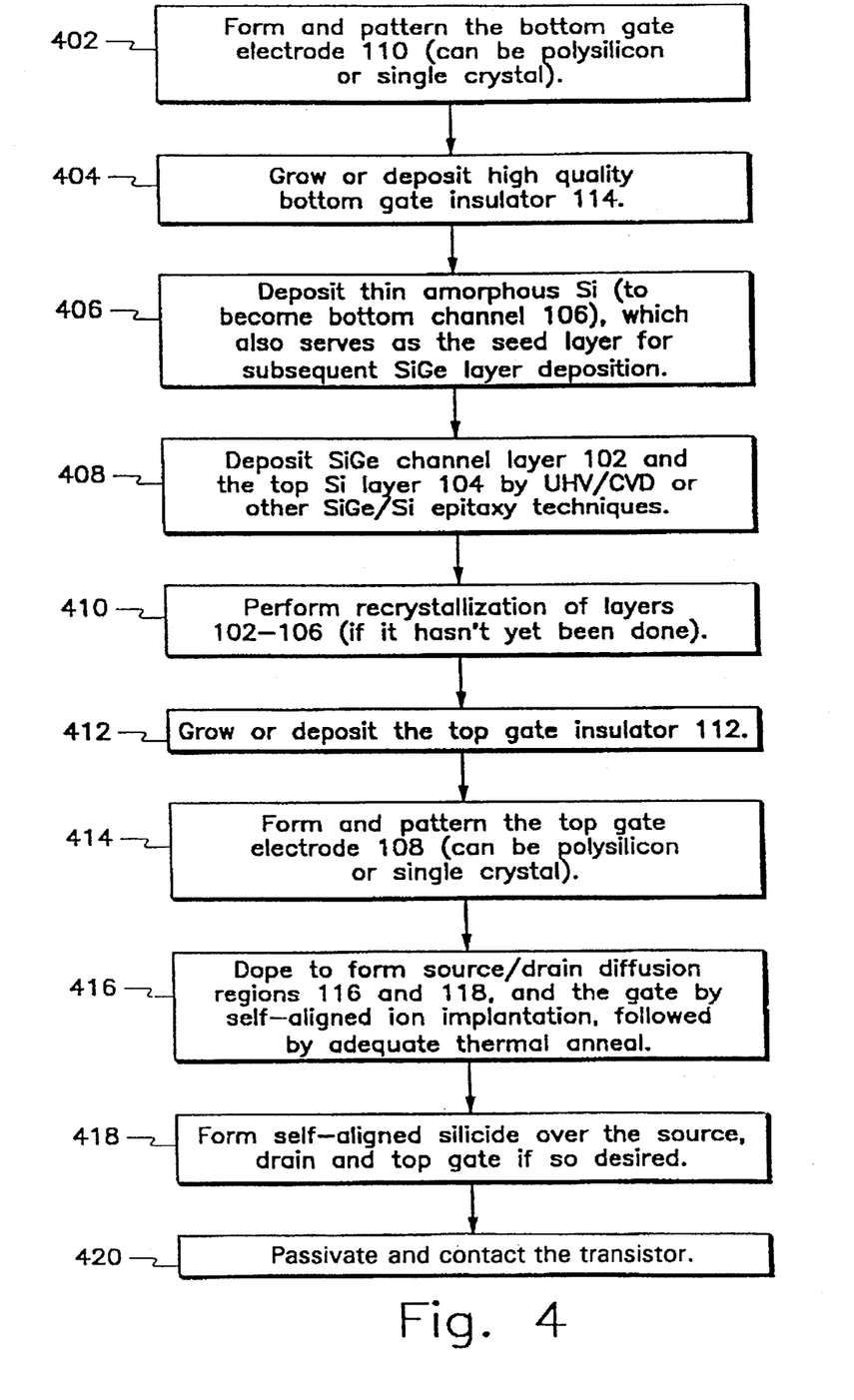
FIG. 4 shows a flow chart of a method of manufacturing the SiGe TFT of FIG. 1.

The structure of FIG. 1 can be fabricated according to a representative method, which is shown generally at steps 402–420 in a flow chart at FIG. 4. The bottom gate electrode 110 is first formed and patterned on the oxide or Si substrate using polysilicon or single crystal silicon, as shown at step or block 402. Next, a high quality bottom gate insulator 114, such as $SiO_2$, is grown or deposited over the gate electrode and substrate, as shown at step or block 404.

Next, a thin amorphous Si layer (forming bottom channel 106) is deposited on the gate insulator 114. Layer 106 also serves as the seed layer for subsequent SiGe layer deposition (see step 406). Layer 106 can be deposited by a number of available low temperature, low pressure chemical vapor deposition (LPCVD) techniques, or the like. It is possible to perform low temperature recrystallization of layer 106 to form very large grains at this point. α-Si deposited in a UHV/CVD system may provide better recrystallization.

Alternatively, for a thin SOI embodiment where the entire channel (comprising layers 102–106, for example) of the SiGe TFT 100 is monocrystalline, a wafer-bonding and polishing or etch-back process could be used to form the bottom gate electrode 110, gate oxide 114 and the monocrystalline layer 106 on an insulator (or Si) substrate. (See Horie et al., Fabrication of Double-Gate Thin-Film SOI MOSFETs Using Wafer Bonding and Polishing, Technical Digest of the 1991 Solid State Device and Materials Conference, Yokohama, Japan: 165–167.) Layer 106 (as the seed for subsequent pseudomorphic epitaxial growth of layer 102 and 104) can be thinned down to the desired thickness (e.g., 5 nm or less) by known oxidation and etching methods.

The SiGe channel layer 102 is then grown to a suitable thickness, thin enough to maintain a pseudomorphic monocrystalline structure. Channel layer 102 may range in thickness from 10 to 50 nm. The top Si layer 104 is formed by UHV/CVD or other SiGe/Si epitaxy techniques, as shown at step 408. Recrystallization of layers 102–106 may be performed if necessary (see step 410). The Si and SiGe layers can be doped individually in situ during UHV/CVD to adjust the threshold voltages of the top and bottom devices. The top gate insulator 112 is then grown or deposited, as shown at step 412. The top and bottom Si layers are used to maintain high quality interfaces with the $SiO_2$ gate insulators and the channel. Next, the top gate electrode 108 is formed and patterned (see step 414). The top gate electrode 108 can be polysilicon or single crystal.

The source/drain diffusion regions 116 and 118 and the gate are then doped by self-aligned ion implantation, followed by adequate thermal anneal. These steps are represented at block 416. A self-aligned silicide may be formed over the source, drain and top gate if so desired, as shown at step 418. Finally, the SOI or TFT MOSFET is passivated and contacted in a known manner, as shown at step 420.

An alternative way of forming the thin Si seed layer (bottom channel 106) is to deposit α-Si immediately after CVD oxide deposition (bottom gate insulator) by changing the chemistry (e.g., turning off the gas source that provides oxygen). For example, LPCVD can be used and switched from silane+oxygen (oxide deposition) to silane only (Si deposition).

The SOI or TFT MOSFETs of the present invention can be used in high speed (sub 4–5 ns) and high density ($\geq 4$ Mb) SRAM or in high performance SOI logic devices, as well as many other present and future applications appropriate for MOSFETs.

For applications requiring MOSFET's with thicker channel regions, the percentage of Ge in the SiGe alloy channel layer is graded within the channel layer to a single peak percentage level. The location of carriers within the channel layer will coincide with this peak percentage level. The SiGe channel layer is thereby formed with a Ge profile designed to maximize transconductance. The Ge profile results in a built-in electric field which locates the carriers in the desired position in the channel. The Ge percentage is about 50% or less at the peak. Typically, the percentage may range between 20 and 40%. Preferably, the maximum percentage level of Ge will be about 30%.

While various embodiments of the present invention have been described above, it should be understood that they have been presented by way of example, and not limitation. Thus the breadth and scope of the present invention should not be limited by any of the above-described exemplary embodiments, but should be defined only in accordance with the following claims and their equivalents. It will be understood by those skilled in the art that various changes in form and detail may be made therein without departing from the spirit and scope of the invention.

What is claimed is:

1. A thin film semiconductor device for modulating carriers, comprising:

an insulating substrate;

a first layer of semiconductor material on said substrate, having one of:
(a) a first valence band edge of a first predetermined value, and
(b) a first conduction band edge of a second predetermined value;

second and third layers of semiconductor material on said substrate and sandwiching said first layer, said second and third layers each having one of:
(a) a second valance band edge of a third predetermined value, said third value being lower than said first value, and
(b) a second conduction band edge of a fourth predetermined value, said fourth value being higher than said second value, wherein said first layer is Si and said second and third layers are SiGe;

first and second semiconductor regions formed in said first through third layers, said first and second regions having high dopant concentrations to thereby function as a source and drain, respectively;

first and second insulating layers sandwiching at least said first through third layers thereby defining a body thickness less than about 20 nm; and first and second gate electrodes sandwiching at least the combination of said first and second insulating layers and said first through third layers for controlling the modulation of the carriers between said first and second regions in said first layer, and wherein said body thickness is thin enough to cause the carriers to be substantially confined to said first layer during operation.

2. A process for fabricating a thin film field effect transistor, comprising the steps of:

forming a first gate electrode on an insulating substrate;

forming a first gate insulator layer on said first gate electrode;

forming a first epitaxial layer of a first semiconductor material on said first gate electrode;

forming a strained, pseudomorphic, epitaxial channel layer of an alloy of said first semiconductor material and a second semiconductor material over said first epitaxial layer;

forming a second epitaxial layer of said first semiconductor material on said channel layer;

forming a second gate insulator layer on said second epitaxial layer;

forming a second gate electrode on said second gate insulator layer; and forming source and drain regions of a first conductivity type in said first and second epitaxial layers and said channel layer and on opposite sides of said first and second gate electrodes.

3. A thin film semiconductor device for modulating carriers, comprising:

an insulating substrate;

a first layer of semiconductor material on said substrate, having one of:
(a) an first valence band edge of a first predetermined value, and
(b) an first conduction band edge of a second predetermined value;

second and third layers of semiconductor material on said substrate and sandwiching said first layer, said second and third layers each having one of:
(a) a second valence band edge of a third predetermined value, said third value being higher than said first value, and
(b) a second conduction band edge of a fourth predetermined value, said fourth value being lower than said second value;

fourth and fifth layers of semiconductor material sandwiching said first through third layers and having valence and conduction band structures substantially similar to said first layer;

first and second semiconductor regions formed in said first through fifth layers, said first and second regions having high dopant concentrations to thereby function as a source and a drain, respectively;

first and second insulating layers sandwiching at least said first through fifth layers thereby defining a body thickness; and first and second gate electrodes sandwiching at least the combination of said first and second insulating layers and said first through fifth layers for controlling the modulation of the carriers between said first and second regions in said second and third layers;

wherein said body thickness is thin enough to cause the carriers to be substantially confined to said second and third layers during operation.

4. A thin film semiconductor device for modulating carriers, comprising:

an insulating substrate;

a first layer of semiconductor material on said substrate, having one of:
(a) a first valence band edge of a first predetermined value, and
(b) a first conduction band edge of a second predetermined value;

second and third layers of semiconductor material on said substrate and sandwiching said first layer, said second and third layers each having one of:
(a) a second valance band edge of a third predetermined value, said third value being lower than said first value, and
(b) a second conduction band edge of a fourth predetermined value, said fourth value being higher than said second value, wherein said first layer is SiGe and said second and third layers are Si, and wherein the concentration of Ge in said first layer is between about 10–50% and said Ge concentration has a single peak percentage level positioned at a predetermined location spaced between first and second opposed major surfaces of said first layer, said predetermined location being selected to optimize device transconductance with said channel layer;

first and second semiconductor regions formed in said first through third layers, said first and second regions having high dopant concentrations to thereby function as a source and a drain, respectively;

first and second insulating layers sandwiching at least said first through third layers thereby defining a body thickness less than about 20 nm; and first and second gate electrodes sandwiching at least the combination of said first and second insulating layers and said first through third layers for controlling the modulation of the carriers between said first and second regions in said first layer, and wherein said body thickness is thin enough to cause the carriers to be substantially confined to said first layer during operation.

5. A thin film semiconductor device for modulating carriers, comprising:

an insulating substrate;

a first layer of semiconductor material on said substrate, having one of:
(a) a first valence band edge of a first predetermined value, and
(b) a first conduction band edge of a second predetermined value;

second and third layers of semiconductor material on said substrate and sandwiching said first layer, said second and third layers each having one of:
(a) a second valance band edge of a third predetermined value, said third value being lower than said first value, and
(b) a second conduction band edge of a fourth predetermined value, said fourth value being higher than said second value, wherein said first layer is less than about 10 nm, and said second and third layers are less than about 5 nm;

first and second semiconductor regions formed in said first through third layers, said first and second regions having high dopant concentrations to thereby function as a source and drain, respectively;

first and second insulating layers sandwiching at least said first through third layers thereby defining a body thickness; and first and second gate electrodes sandwiching at least the combination of said first and second insulating layers and said first through third layers for controlling the modulation of the carriers between said first and second regions in said first layer, and wherein said body thickness is thin enough to cause the carriers to be substantially confined to said first layer during operation.

6. The semiconductor device of claim 1, wherein said first layer is less than about 10 nm, and said second and third layers are less than about 5 nm.

7. The semiconductor device of claim 6, wherein said first layer is between about 4–6 nm, and said second and third layers are between about 2–3 nm.

8. The semiconductor device of claim 3, wherein said first, fourth and fifth layers are Si and said second and third layers are SiGe.

9. The semiconductor device of claim 8, wherein the Ge concentration in said second and third layers has a single peak percentage level positioned at a predetermined location spaced between first and second opposed major surfaces of each of said second and third layers, said predetermined location being selected to optimize device transconductance with said second and third layers.

10. The semiconductor device of claim 3, wherein said first layer is modulation doped.

11. The semiconductor device of claim 3, wherein said first, fourth and fifth layers are SiGe and said second and third layers are Si.

12. The semiconductor device of claim 3, wherein said first, fourth and fifth layer are less than about 5 nm, and said second and third layers are less than about 10 nm.

13. The semiconductor device of claim 12, wherein said first, fourth and fifth layer are between about 2–3 nm, and said second and third layers are between about 4–6 nm.

14. The semiconductor device of claim 3, wherein said body thickness being less than about 35 nm.

15. The semiconductor device of claim 5, wherein said first layer is SiGe and said second and third layers are Si.

16. The semiconductor device of claim 15, wherein the concentration of Ge in said first layer is between about 10–50%.

17. The semiconductor device of claim 16, wherein said Ge concentration has a single peak percentage level positioned at a predetermined location spaced between first and second opposed major surfaces of said first layer, said predetermined location being selected to optimize device transconductance with said channel layer.

18. The transistor of claim 17, wherein said predetermined location is the middle of said channel layer.

* * * * *